United States Patent [19]
Euen et al.

[11] Patent Number: 5,139,869
[45] Date of Patent: Aug. 18, 1992

[54] THIN DIELECTRIC LAYER ON A SUBSTRATE

[76] Inventors: Wolfgang Euen, Landhausstr. 5, 7030 Boeblingen; Dieter Hagmann, Sonnenhalde 4, 7277 Wildberg 4; Hans Jurgen Wildau, Künheimer Weg 12, 1000 Berlin 47, all of Fed. Rep. of Germany

[21] Appl. No.: 686,086
[22] Filed: Apr. 16, 1991

Related U.S. Application Data

[62] Division of Ser. No. 400,300, Aug. 29, 1989, Pat. No. 5,051,377.

Foreign Application Priority Data

[30] Sep. 1, 1988 [EP] European Pat. Off. ........ 88114239.2

[51] Int. Cl.$^5$ ..................... B32B 17/06; H01L 21/265
[52] U.S. Cl. .................................... 428/336; 428/446; 428/450; 428/702; 427/38; 357/23.15; 437/24
[58] Field of Search ............... 437/16, 20, 94, 173, 437/225, 24; 250/492.2, 492.21, 492.3; 357/23.8, 23.15; 428/336, 446, 450, 698, 704, 702; 427/38

[56] References Cited

U.S. PATENT DOCUMENTS

| | | | |
|---|---|---|---|
| 3,540,925 | 11/1970 | Athans et al. | 437/7 |
| 3,852,120 | 12/1974 | Johnson et al. | 437/37 |
| 4,001,049 | 1/1977 | Baglin et al. | 357/23.8 |
| 4,266,985 | 5/1981 | Ito et al. | 437/20 |
| 4,701,422 | 10/1987 | Elliot | 437/29 |
| 4,759,993 | 7/1988 | Pai et al. | 428/450 |
| 4,851,370 | 7/1989 | Doklan et al. | 437/225 |
| 4,996,081 | 2/1991 | Ellul et al. | 427/255.7 |

FOREIGN PATENT DOCUMENTS

| | | | |
|---|---|---|---|
| 1020849 | 11/1977 | Canada | 148/2.1 |
| 0260473 | 3/1988 | European Pat. Off. | |
| 146877 | 3/1981 | Fed. Rep. of Germany | 437/24 |
| 85041 | 6/1980 | Japan | 437/28 |
| 125846 | 10/1981 | Japan | 437/24 |
| 125847 | 10/1981 | Japan | 437/24 |
| 1289740 | 9/1972 | United Kingdom | 437/16 |

OTHER PUBLICATIONS

Cass, T. R., "Anomalous Residual Damage in Si After Annealing Through-Oxide Arsenic Implantations" Apl. Phys. Lett., vol. 23, Sep. 1, 1973, pp. 268-270.

Fowler et al., "MOSFET Devices with High-Gate Dielectric Integrity", I.B.M. Tech. Discl. Bull., vol. 17, No. 3, Jun. 1974, p. 270.

Vromen, B. H., "Ion Implantation Into and Through Silicon Dioxide; Its Influence on Oxide Integrity", Electrochem. Soc. Fall Mtg., Extended Abstracts, vol. 75-2, Abstract 133 (Oct. 5-10, 1975) pp. 341-342.

Vromen, B. H., "Electron Trapping and Dielectric-Strength Enhancement in Radiation-Damaged Silicon Dioxide", Extended Abstracts, vol. 77-2, Abstract No. 215 (Oct. 1977) pp. 563-565.

Irene, E. A., "Methods To Reduce Defects in Very Thin $SiO_2$ Films", IBM Tech. Discl. Bull., vol. 21, No. 1 (Jun. 1978) pp. 1978-1979.

Briska, M., et al., "Reduction of Charge in Silicon Dioxide Layers by Use of Chlorine Ion Implantation", IBM Tech. Discl. Bull., vol. 23, No. 7A (Dec. 1980), p. 2768.

Osburn, C. M., et al., "Edge Breakdown of Poly-Si Gates Over Thin Oxides During Ion Implantation", Extended Abstracts, vol. 82-2, Abstract No. 177 (Oct. 1982) p. 278.

Roberts, S., et al., "Insulator Film Stack for Very Small Area Capacitors", IBM Tech. Discl. Bull., vol. 28, No. 3, (Aug. 1985) pp. 1361-1362.

Lee, J. et al., "Statistical Modeling of Silicon Dioxide Reliability", IEEE 26th Annual Proceedings, Reliability Physics, Monteray, Calif. (Apr. 12-14, 1988) pp. 131-138.

*Primary Examiner*—Ellis P. Robinson
*Assistant Examiner*—Frank Rosenberg
*Attorney, Agent, or Firm*—William D. Sabo

[57] ABSTRACT

Disclosed is a thin dielectric inorganic layer overlaying a substrate, and having a thickness of $\leq$ about 20 nm and a defect density of $\leq$ about 0.6 defects/cm$^2$ determined by BV measurements.

Also disclosed is a method of forming such a layer, according to which a layer having the desired composition and thickness is formed on a substrate, followed by an ion implantation into the substrate through the layer with a dose of $\geq$ about $10^{15}$ ions/cm$^2$ and a subsequent anneal at a temperature of $\geq$ about 500° C. for a predetermined time.

5 Claims, 1 Drawing Sheet

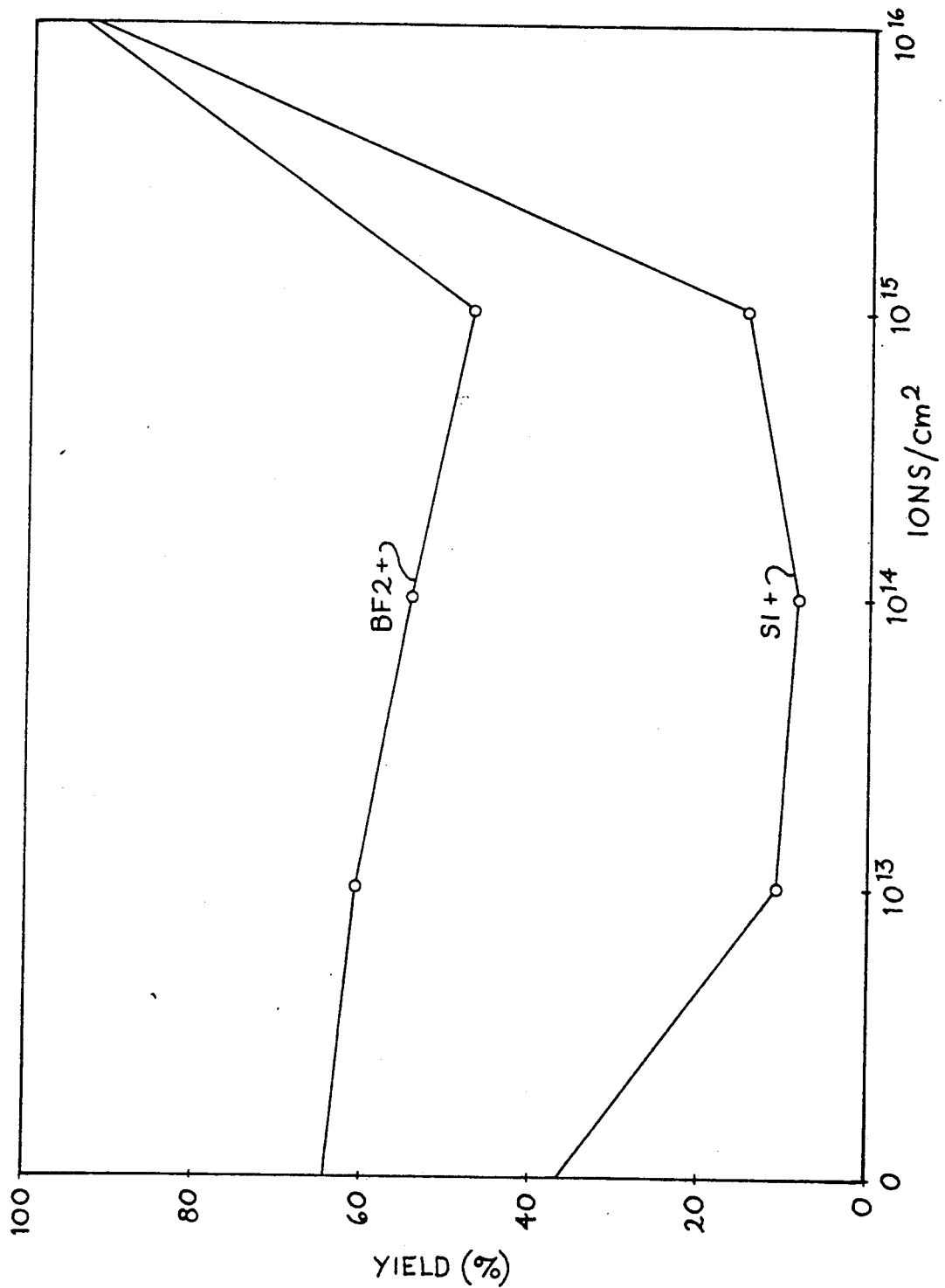

THIN DIELECTRIC LAYER ON A SUBSTRATE

This application is a divisional application of Ser. No. 07/400,300 filed on Aug. 29, 1989 now U.S. Pat. No. 5,051,377.

DESCRIPTION

1. Field of the Invention

This invention relates to a thin dielectric inorganic layer with a low defect density and to a method for forming such a layer.

2. Background of the Invention

Particularly in the field of semiconductor technology, there has been a problem of producing thin dielectric layers having a sufficiently high breakdown voltage, not only locally, but over the entire layer surface. Great expenditure has been made, therefore, to develop methods for forming high quality dielectric layers or for improving the dielectric properties of existing layers.

In DE-A-2,314,746, a method is described where, during the thermal oxidation of silicon, a chlorine compound, i.e. $CCl_4$, is injected with the oxidizing agent. The thickness of the layers grown by this method is of the order of 50 nm. The method is able to increase the breakdown voltage and to stabilize the flatband voltage.

A similar method is described in the article, "Reduction of Charge in Silicon Dioxide Layers by Use of Chlorine Ion Implantation", by M. Briska, IBM Tech. Discl. Bull., Vol. 23, No. 7A (December 1980), p. 2768. The chlorine is implanted with a dose of $2 \times 10^{13}$ ions/$cm^2$ into a 220 nm thick anodic silicon dioxide layer, which is then annealed for 10 minutes in nitrogen at a temperature of 1000° C. With this method, positive metal ions, such as sodium, aluminum and iron, in the silicon dioxide layer can be reduced considerably, with the consequence that breakdown voltages are increased and leakage problems reduced.

In the article, "MOSFET Devices with High-Gate Dielectric Integrity", by A. B. Fowler, IBM Tech. Discl. Bull., Vol. 17, No. 1 (June 1974), p. 270, it is described, that a high temperature (1100°-1300° C.) hydrogen anneal greatly reduces the breakdown defect density in a subsequently grown, thin silicon dioxide layer, the thickness of which is not defined. In this article, it is also mentioned, that to achieve high doping in the area underneath the thin silicon dioxide layer, the use of ion implantation through the thin oxide layer is an alternative.

However, in reducing the thickness of the dielectric layers further in order to meet the increasing microminiaturization, especially in information technology, it has been found, that it is disproportionately more difficult to keep the defect density at a low level. The reasons for this are not exactly known. On the one hand, there is a suspicion, that an ion implantation through a thin dielectric layer is detrimental to it. On the other hand, in U.S. Pat. No. 4,001,049 a method is described for improving the dielectric breakdown of, for example, a 20 nm thick $SiO_2$-layer by implanting, for example, argon or hydrogen ions with a dose of $>1.8 \times 10^{13}$ (for argon) or $>3.4 \times 10^{16}$ (for hydrogen) ions/$cm^2$, followed by an anneal at temperatures between 200 and 800° C. However, it is emphasized in the patent, that the ions must be of insufficient energy to penetrate completely through the silicon dioxide layer and—though certainly the average breakdown voltage is increased by the method—the defect density achieved is still not satisfactory.

In another method described in the article, "Insulator Film Stack for Very Small Area Capacitors", IBM Tech. Discl. Bull., Vol. 28, No. 3 (August 1985), p. 1361, a transition metal oxide, such as hafnium oxide, is inserted, in a three layer stack of dielectric films, which allows creation of capacities equivalent to 6 to 10 nm of thermal $SiO_2$ in a total actual stack thickness of 12 to 18 nm, providing capacitors with improved voltage breakdown and higher charge storage capacity per unit area characteristics. However, this method, besides being rather complicated and useful for special purposes only, likewise does not achieve a thorough solution of the high defect density problem in very thin dielectric layers.

SUMMARY OF THE INVENTION

It is, therefore, one object of the invention to provide a dielectric layer having a thickness on the order of less than 20 nm and a low defect density based on a predetermined minimal breakdown voltage.

It is another object of the invention to provide a method for forming very thin dielectric layers having a low defect density with regard to a predetermined minimal breakdown voltage that has to be exceeded.

It is a further object of the invention to provide a method for forming such layers reproducibly in a manufacturing enviornment.

It is still another object of the invention to provide a method for forming such layers with comparatively low costs.

In accordance with the invention, there is provided a dielectric inorganic layer on a substrate, the dielectric inorganic layer having a thickness of $\leq$ about 20 nm and a defect density of $\leq$ about 0.6 defects/$cm^2$.

In another aspect of the invention, there is provided a method for forming a dielectric inorganic layer, comprising the steps of forming on a substrate a dielectric inorganic layer having a thickness $\leq$ about 20 nm, implanting ions into the substrate through the layer with a dose of $\leq$ about $10^{15}$/$cm^2$ and annealing the layer at a temperature of $\geq$ about 500° C. for a predetermined time, wherein the resulting layer has a defect density of $\leq$ 0.6 defects/$cm^2$.

Defect density in this context means the number of defects per $cm^2$, with the defects being short circuits or $E_{BD}$ values of $<9$ MV/cm.

In relation to their thickness, the layers of the invention have a remarkably low defect density. In fact, the layers can have a thickness distinctly less than about 20 nm, e.g. less than about 10 nm, and still have a defect density of about 0.2 defects per $cm^2$. The layers can be deposited, not only on silicon, but also on other materials, especially metals. These properties make the layers, not only suitable for VLSI-applications, but also for forming trench capacitors and screens. These screens, which form a flat optical display, use MIM (metal-insulator-metal) thin film cathodes as an electron source. The electrodes consist, for example, of cesium. One of the electrodes is continuous and the other consists of dots. It is necessary that the electrodes be separated by a high quality very thin dielectric layer.

Two particular aspects of the method of the invention are surprising: That ion implantation—contrary to expectations—can achieve such an improvement in defect density and that only a rather high dose, i.e. $\geq$ about $10^{15}$ atoms/$cm^2$, can accomplish that result. The method can be practiced with all ions commonly used for ion implantation applications. For example, B, P, As, Si, Ar or $BF_2$ ions can be advantageously employed. Naturally, if boron, arsenic or phosphorous ions are implanted through the dielectric layer into a semiconductive substrate, the conductive properties are changed. Therefore, if the substrate consists of silicon and a change in its conductivity is to be avoided, it would be appropriate to implant silicon ions.

It is another advantage of the method of the invention, that it functions independently of the method used for forming the thin layer, i.e. the layers can be grown, for example, by sputtering, wet or dry thermal oxidation or chemical vapor deposition.

According to one particularly advantageous embodiment of the method, a $\leq$ about 10 nm thick gate oxide layer with a defect density < about 0.2 defects/$cm^2$ can be formed by implanting silicon ions into the substrate through the grown gate oxide layer with a dose of $\geq$ about $10^{16}$ atoms/$cm^2$ and by subsequently annealing the structure at a temperature of $\geq$ about 1150° C. The anneal at the high temperature guarantees, that the flatband voltage of the device does not shift. Since this anneal can be very short, i.e. on the order of about 10 seconds, the high anneal temperature is not critical even if the device has received a doping in a previous process step where the doping profile must not change.

The foregoing and other objects, features and advantages of the invention will be apparent from the following more particular description of the preferred embodiments of the invention.

BRIEF DESCRIPTION OF THE DRAWING

The FIGURE shows diagrammatically the defect densities of an about 10 nm thick silicon dioxide layer plotted against doses of silicon and $BF_2$ ions implanted through the silicon dioxide layer where, after the implantation, the layer was annealed at 1000° C. for thirty minutes.

DESCRIPTION OF THE PREFERRED EMBODIMENTS

The substrate to be used in accordance with the invention is not critical. For example, the substrate can comprise silicon, germanium, gallium arsenide or aluminum. Also, in the case of semiconductive substrates, the substrate can have undergone a doping process, i.e. contain differently doped areas including p/n-junctions. It is not required that the surface of the substrate be flat, but it may contain, for example, steps or trenches. On the substrate, the dielectric layers according to the invention are formed.

Layers of silicon dioxide, silicon monoxide, silicon nitride and mixtures of these compounds were studied, as well as stacks of layers containing at least two differently composed layers where the compositions were selected from such compounds and mixtures thereof. The layers were grown using any of the conventional methods, i.e. sputtering, wet and dry thermal oxidation—provided the substrate was silicon, and the layer to be grown, silicon dioxide— and chemical vapor deposition. The thickness of the layers ranged between about 8 and about 20 nm with the thickness being measured conventionally with an ellipsometer. The defect density of the layers as grown (the method to measure the defect density is described below) was not uniform. As can be seen from the FIGURE, the yield of 10 nm thick silicon dioxide layers grown by wet thermal oxidation on a silicon substrate can take values like 36 and 64%. Yields of 36 and 64% correspond to defect densities of 10.6 and 4.6, respectively.

The substrate, such as a silicon wafer, with the grown layer is subjected to ion implantation. In the experiments, the ion implanter model 350D marketed by Varian was used, which is a conventional medium current implanter. Among the ions implanted were boron, phosphorous, arsenic, silicon, argon and $BF_2$. The energy of the ions was chosen in such a way, that the $r_p$ (projected range) exceeded the thickness of the grown dielectric layer. For example, the energy of silicon ions implanted through a 14 nm silicon dioxide layer was $\geq$ 10 keV. The applied dose ranged between $10^{13}$ and $10^{16}$ ions/$cm^2$ for all the applied ions.

Subsequently, the substrates with the grown dielectric layers are subjected to an anneal step in an inert atmosphere. The purpose of the anneal is to repair the damages caused by the ion implantation. To accomplish this, a treatment at a temperature higher than 500° C. in an inert atmosphere is sufficient. The time is not critical, however, at the lower temperatures (i.e. $\leq$ about 800° C.) a duration of between thirty minutes and about two hours is preferred. In case the dielectric layer serves later on as a gate isolation, an anneal temperature of about 500° C. is too low. It will be sufficient to improve the breakdown voltage yield, but the threshold voltage will shift and become unstable. To avoid this, an anneal at a temperature of $\geq$ about 1150° C. is required. At this temperature, p/n-junctions migrate rather fast, therefore, when p/n-junctions are formed in the substrate in previous process steps the high temperature anneal has to be very short. Actually—as pointed out above—the anneal time is not critical and an anneal time of ten seconds is sufficient. Such an anneal can be made in an RTP (rapid thermal processor), e.g., model AG 610 or AG 4100 marketed by AG Associates, in which the substrate temperature can be ramped up at a rate of 200° to 400° C. per second by means of heat radiation emanating from tungsten lamps, to which the substrates are exposed. To cool down the substrate temperature at a rapid rate, it is sufficient to switch off the tungsten lamps. For short anneal cycles, the inert atmosphere can consist of nitrogen; if the anneal cycles take longer, the nitrogen should be replaced by argon.

The result of the described treatment is illustrated in the FIGURE for the cases where silicon or $BF_2$ ions, respectively, were implanted into a 10 nm thick silicon dioxide layer, followed by an anneal at 1000° C. for thirty minutes. The FIGURE shows that independently of the ion used at doses of $\leq 10^{15}$ ions/$cm^2$, the yield decreases or remains about constant and that, when the dose is increased above $10^{15}$ ions/$cm^2$, a dramatic yield increase occurs, with the yield at a dose of $10^{16}$ ions/$cm^2$ being about 93%.

The defect density or the yield is measured by a double ramp method. For the measurement, the samples, such as silicon wafers having a diameter on the order of 100 mm, are prepared by producing on the grown dielectric layer 110 aluminum dots. The dots, having a diameter of 3.5 mm and a thickness of 0.7 um, are each distributed regularly over the wafer surface. At the aluminum dots, the breakdown voltage is measured in the following way: A voltage is applied between the substrate and the aluminum dot with the voltage being ramped up at a rate of 1 volt per second. If, at a field of 9 MV/cm, the current does not exceed 1 $\mu$A, the breakdown voltage at the location of the aluminum dot is considered sufficient. The ramp up of the voltage is repeated (therefore, the expression "double ramp method") in order to trace failures that have occurred but were not detected during the first ramp up.

The measurements reveal the dramatic decrease of the defect density as a result of the ion implantation with doses $\geq$ about $10^{15}$ ions/cm$^2$. It was also found—which is, however, not so important—that the method of the invention does not cause an increase in the absolute value of the breakdown voltage. The effect of the high dose ion implantation cannot be explained. It was found, that no change in the refractive index or the density of the dielectric layer occurred, as was found after the treatment disclosed in U.S. Pat. No. 4,001,049.

The excellent dielectric properties of the layers of the invention make them suitable for VLSI-applications in the field of semiconductor technology or in screens. VLSI-applications primarily concern gate-isolation where, with increasing miniaturization, the thickness of dielectric isolation must decrease where it is, however, essential that the defect density does not increase. Trench capacitors are located in a trench, the walls and the bottom of which is covered with a very thin dielectric layer onto which a polysilicon layer is deposited. This structure allows arrangement of a capacitor having a large area in such a manner so that only a very small amount of the wafer area is consumed, which makes trench capacitors suitable for very densely packed circuits. The screens are of the kind described at the beginning of this specification. The MIM thin film cathode is deposited on a substrate, such as a glass-plate. These screens might be used as flat television screens. The thin dielectric layers produced by the method of the invention improve the performance of these screens considerably due to their uniform predetermined breakdown voltage.

Another embodiment of the method of the invention, i.e. the formation of a gate isolation, will be described in even greater detail below by way of an example:

Five silicon wafers were processed in exactly the same way. The wafers had a homogeneous doping of 4 to $6 \times 10^{15}$ boron atoms/cm$^3$. On the five wafers and on the additional sixth wafer, a 10 nm thick silicon dioxide layer was blanket grown by thermal oxidation where the wafers were subjected at a temperature of 750° C. to an atmosphere containing air and water vapor. The uniformity of the layer thickness was verified ellipsometrically.

On the additional sixth wafer, the defect density was measured at this state by using the double ramp method as described above, i.e. by forming the 110 aluminium dots and then measuring the breakdown voltage or the field, respectively, at them. The yield was 49%. In addition, at the sixth wafer the flatband voltage was measured using conventional procedure.

Into the thin silicon dioxide layer on the five wafers, silicon ions were blanket implanted with a dose of $10^{16}$ ions per cm$^2$ and an energy of the ions of about 10 KeV using a model 350D Varian implanter. Subsequently, the wafers were annealed in a rapid thermal processor (model AG 610 marketed by AG Associates) where the temperature of the wafers was ramped up at a rate of about 350° C./sec up to a temperature of about 1150° C., that was held for about 10 seconds. Subsequently, the heating was switched off to allow a rapid cooling of the wafers. During the anneal, 3 1 of N$^2$/min. streamed through the RTP. The five wafers were prepared for the BV-measurement exactly as described in connection with the additional sixth wafer. Finally, using the double ramp method as described above, the breakdown voltage on the field was measured at the five wafers. The defect density was $0.5 \pm 0.2$/cm$^2$ corresponding to a yield of $95 \pm 2\%$, i.e. the results were very uniform and reproducible. In addition, the flatband voltage was measured such as on the sixth additional wafer. It was found that the threshold voltage had not been changed by the ion implantation and the anneal.

While the invention has been particularly shown and described with reference to preferred embodiments thereof, it will be understood by those skilled in the art that various changes in form and details may be made therein without departing from the spirit and scope of the invention.

What is claimed is:

1. A low defect density silicon dioxide layer on a substrate, wherein said substrate comprises a material selected from the group consisting of silicon, germanium, gallium, arsenide and aluminium, prepared by: forming on said substrate a thin silicon dioxide layer having a thickness ranging from about 8 to about 20 nm, implanting ions into said substrate through said layer with a dose of $\geq$ bout $10^{16}$/cm$^2$ and annealing said layer at a temperature of $\geq$ about 1150° C. for a predetermined time, wherein said resulting layer has a defect density of about 0.5 $+/-$ about 0.2 defects/cm$^2$.

2. A low defect density silicon dioxide gate isolation layer having a thickness ranging from about 8 to about 20 nm on a silicon substrate, prepared by: forming said silicon dioxide layer by thermal oxidization, implanting silicon ions into said substrate through said silicon dioxide layer with a dose of $\geq$ about $10^{16}$ ions/cm$^2$ and annealing said silicon dioxide layer at a temperature of $\geq$ about 1150° C.

3. The silicon dioxide gate isolation layer of claim 2, wherein said annealing step is carried out for about 10 seconds in an inert atmosphere and further wherein, during said annealing step, the substrate temperature is ramped up at a rate of about 200 to about 400° per second, held at the anneal temperature for about 10 seconds and cooled rapidly.

4. The layer of claim 1, wherein said layer forms a gate isolation, a dielectric in a trench capacitor or a dielectric of a screen separating layers of metal.

5. The layer of claim 4, wherein said metal is cesium.

* * * * *